(12) United States Patent
Kirichenko et al.

(10) Patent No.: US 8,050,648 B1
(45) Date of Patent: Nov. 1, 2011

(54) SUPERCONDUCTING DIGITAL MIXER

(75) Inventors: Alexander F. Kirichenko, Pleasantville, NY (US); Deepnarayan Gupta, Hawthorne, NY (US); Saad Sarwana, White Plains, NY (US)

(73) Assignee: Hypres, Inc., Elmsford, NY (US)

( * ) Notice: Subject to any disclaimer, the term of this patent is extended or adjusted under 35 U.S.C. 154(b) by 0 days.

(21) Appl. No.: 12/725,426

(22) Filed: Mar. 16, 2010

Related U.S. Application Data (63) Continuation of application No. 11/243,019, filed on Oct. 4, 2005, now Pat. No. 7,680,474.

(51) Int. Cl.
| | |
|---|---|
| H04B 1/26 | (2006.01) |
| H04B 1/18 | (2006.01) |
| H04B 1/16 | (2006.01) |
| H04B 7/216 | (2006.01) |
| H04B 10/00 | (2006.01) |
| H03K 19/195 | (2006.01) |
| H03K 19/21 | (2006.01) |
| H03K 3/289 | (2006.01) |
| H03K 17/00 | (2006.01) |
| G06F 7/50 | (2006.01) |
| G06F 15/00 | (2006.01) |
| H03B 19/00 | (2006.01) |
| H03B 15/00 | (2006.01) |
| G11C 11/44 | (2006.01) |
| G11C 11/00 | (2006.01) |
| H01L 39/22 | (2006.01) |
| H03M 1/00 | (2006.01) |
| H04L 27/00 | (2006.01) |
| H04L 25/03 | (2006.01) |
| H04L 25/49 | (2006.01) |
| H04L 27/06 | (2006.01) |
| H04K 1/02 | (2006.01) |

(52) U.S. Cl. ............ 455/323; 455/189.1; 455/209; 455/293; 326/3; 326/52; 327/117; 327/202; 327/407; 331/107 S; 341/133; 365/154; 370/342; 375/295; 375/297; 375/343; 398/155; 708/493

(58) Field of Classification Search .............. 455/323, 455/112, 189.1, 209, 293, 326; 341/133, 341/143, 155, 126, 158–160, 171; 708/625, 708/627, 630; 375/343, 205–206, 286, 295, 375/326, 371; 326/1–4, 6, 7, 52–54; 327/3–12, 327/116–119, 185, 186, 366–367, 527–528; 331/42–43, 53, 107 S; 370/206, 211, 314, 370/335, 342, 380, 386, 411, 499, 532–534, 370/537, 916; 398/155

See application file for complete search history.

(56) References Cited

U.S. PATENT DOCUMENTS 5,406,216 A * 4/1995 Millman et al. ............ 327/202

(Continued)

OTHER PUBLICATIONS

Likharev, et al, "RSFQ Logic/Memory Family: A New Josephson-Junction Technology for Sub-Terahertz-Clock-Frequency Digital Systems", IEEE Transactions on Applied Superconductivity, vol. 1, No. 1, Mar. 1991, pp. 3-28.

Polonsky, et al., "Single Flux, Quantum B Flip-Flop and Its Possible Applications", IEEE, vol. 4, No. 1, Mar. 1994, pp. 9-18.

(Continued)

*Primary Examiner* — Andrew Wendell
*Assistant Examiner* — Paul P Tran
(74) *Attorney, Agent, or Firm* — Steven M. Hoffberg; Ostrolenk Faber LLP (57) ABSTRACT

Digital mixers which permit mixing of asynchronous signals may be constructed of Rapid Single Flux Quantum (RSFQ) logic elements. The logic elements may include an RSFQ non-destructive readout cell (NDRO), an RSFQ D flip-flop, an RSFQ XOR circuit, and an RSFQ T flip-flop. A binary tree arrangement of T flip-flops can be used to provide in-phase and quadrature phase-divided replicas of a reference signal. The mixing elements can be either an XOR circuit, a dual port NDRO circuit functioning as a multiplexer or an RS type NDRO functioning as an AND gate. The RSFQ logic elements utilize Josephson junctions which operate in superconducting temperature domains.

20 Claims, 13 Drawing Sheets

U.S. PATENT DOCUMENTS

| | | | |
|---|---|---|---|
| 5,631,929 A * | 5/1997 | Jones et al. | 375/295 |
| 5,818,373 A | 10/1998 | Semenov et al. | |
| 5,963,351 A * | 10/1999 | Kaplounenko et al. | 398/155 |
| 6,420,895 B1 * | 7/2002 | Herr et al. | 326/3 |
| 6,724,216 B2 | 4/2004 | Suzuki et al. | |
| 6,836,154 B2 | 12/2004 | Fredriksson | |
| 6,917,537 B2 | 7/2005 | Bunyk | |
| 7,257,609 B1 * | 8/2007 | Kosunen et al. | 708/493 |
| 7,944,253 B1 * | 5/2011 | Kirichenko | 327/117 |
| 2004/0022332 A1 * | 2/2004 | Gupta et al. | 375/343 |
| 2004/0120299 A1 | 6/2004 | Kidiyarova-Shevchenko et al. | |
| 2005/0235027 A1 | 10/2005 | Jung et al. | |
| 2007/0021933 A1 * | 1/2007 | Sanduleanu et al. | 702/72 |

OTHER PUBLICATIONS

Kirichenko, et al., "4-bit Rapid Single-Flux-Quantum Decoder", IEEE, vol. 5, No. 2, Mar. 1995, pp. 2857-2860.

Kirichenko, et al., "Superconductor Digital Receiver Components", IEEE, vol. 15, No. 2, Jun. 2005, pp. 1-7.

Fei, "Frequency Divider Design Strategies", Broadband Technology, Mar. 2005, pp. 18-26.

Gilbert, "A Precise Four-Quadrant Multiplier with Subnanosecond Response", IEEE, vol. SC-3, Dec. 1968, pp, 365-373.

Yu, et al., "RSFQ Asynchronous Serial Multiplier and Spreading Codes Generator for Multiuser Detector", IEEE, vol. 13, No. 2, Jun. 2003, pp. 429-432.

* cited by examiner

SUPERCONDUCTING DIGITAL MIXER

CROSS REFERENCE TO RELATED APPLICATIONS

The present application is a continuation of U.S. application Ser. No. 11/243,019, filed Oct. 4, 2005, now U.S. Pat. No. 7,680,474, the entirety of which is expressly incorporated herein by reference.

GOVERNMENT INTERESTS

This invention was made with Government support under Contract Numbers N00014-02-C-0005, N00014-03-C-0082 and N00014-03-C-0370 awarded by the Department of the Navy. The Government has certain rights in the invention.

BACKGROUND OF THE INVENTION

1. Field of the Invention

The invention described herein relates to the field of superconductivity, and more specifically relates to circuits and techniques for implementing digital quadrature mixers using Josephson junctions.

2. Related Art

Josephson junctions are quantum-mechanical circuit elements of superconducting devices. The Josephson effect in particular results from two superconductors acting to preserve long-range order across a barrier, such as an insulating barrier. With a thin enough barrier, the phase of the electron wave function in one superconductor maintains a fixed relationship with the phase of the wave function in another superconductor. This linking up of phases is called phase coherence.

A Josephson junction is the interface between two superconducting materials separated by a non-superconducting barrier. A current may flow freely within the superconductors but the barrier prevents the current from flowing freely between them. However, a supercurrent may tunnel through the barrier depending on the quantum phase of the superconductors. The amount of supercurrent that may tunnel through the barriers is restricted by the size and substance of the barrier. The maximum value the supercurrent may obtain is called a critical current of the Josephson junction.

Josephson junctions have two basic electrical properties. The first is that the junctions have inductive reactance. That is, similar to inductors, the voltage difference across the junction is related to the time rate of change of the current. The second is that a constant voltage across the junction will produce an oscillating current through the barrier, and vice versa. Thus, Josephson junctions convert a direct current voltage to an alternating current.

A family of logic/memory devices were proposed using Josephson junctions the IEEE Transactions on Applied Superconductivity, Volume 1, Number 1, March 1991, by K. K. Likharev and V. K. Semenov in an article entitled, RSFQ Logic/Memory Family: A New Josephson junction Technology For Sub-Terahertz-Clock-Frequency Digital Systems. That article is hereby incorporated by reference in its entirety into specification of this application.

RSFQ circuits are widely recognized as the fastest digital circuits in any electronic technology, and this is also true of RSFQ digital mixers. The digital mixers described in the present invention constitute the first practical circuits for the implementation of digital mixers in a complete RSFQ digital receiver system, and have been demonstrated for clock speeds up to 40 GHz.

Prior art attempts at producing digital mixers in the superconducting domain required synchronism between an incoming signal and a reference signal.

BRIEF SUMMARY OF THE INVENTION

The invention described herein is related to circuits and techniques for implementing digital mixers utilizing Josephson junction technology, which don't require synchronism between the incoming signal and a reference signal.

The purpose of the invention is to provide a digital quadrature mixer, which overcomes the problems of the prior art.

DETAILED DESCRIPTION OF THE INVENTION

An important component of any digital receiver is a digital I/Q Mixer for converting narrowband (about 5 MHz) signals down from a few GHz. To achieve this goal with maximum efficiency the invention uses a circuit that is similar in principle to the Gilbert quadrature mixer. See article by B. Gilbert, "A Precise Four Quadrant Multiplier With Sub nanosecond Response," IEEE. J. Solid-State Circuits, Vol. SC-3, pp. 365-373, December 1968. The basic idea of this mixer is to use square waves as a local oscillator signal instead of sine waves. The mathematical representation of a square wave is $G(t)=\text{sign}[\sin(\omega_{LO} t)]$, where $\omega_{LO}$ is a local oscillator frequency. The digital version of such a mixer is comparably easy to implement in RSFQ in case of single-bit coding, such as at the output of a delta-sigma modulator.

Figure 1:
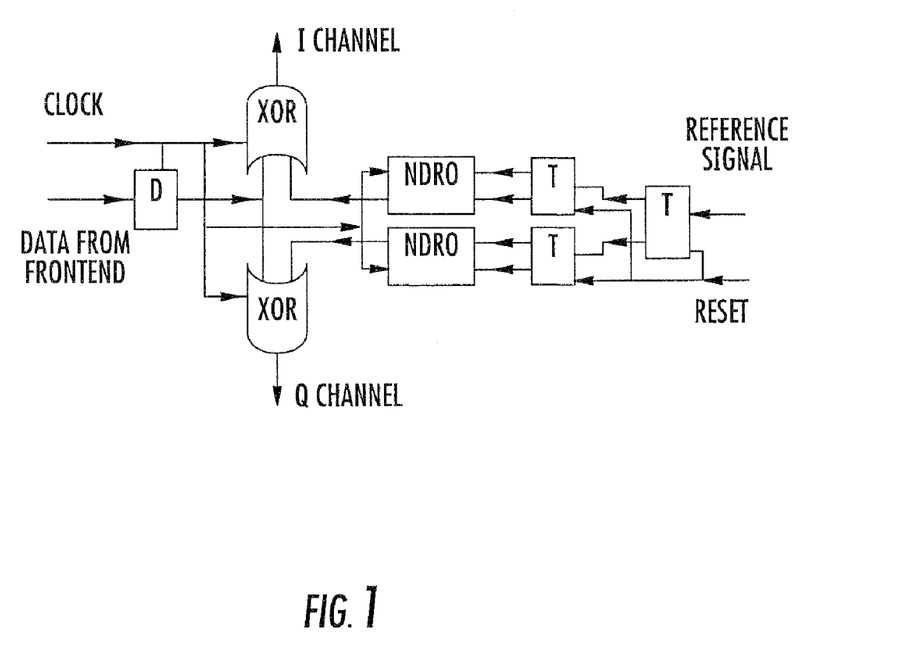
FIG. 1 is an exemplary embodiment of an XOR based digital Mixer in accordance with one aspect of the invention.

The first implementation of a square wave digital mixer in RSFQ is shown in FIG. 1. The right side of the device on the block diagram serves as a single-bit square wave generator with quadrature outputs. Although, FIG. 1 is shown as a two channel I/Q Mixer, the principles of the invention apply to a single channel mixer as well. As shown, the binary tree of resettable T flip-flops creates two (I and Q) local oscillator signals with 90 degree relative phase shift. The T flip-flops control RS-type NDRO cells, which, in turn, create digital square waves turning on and off a stream of SFQ pulses. A modulated signal gets mixed with 90 degree. shifted square waves in XOR cells, producing I channel and Q channel output products. An RS-type NDRO cell and a T flip-flop is used, instead of a T-type NDRO cell, in order to avoid a possible collision between the NDRO read-out pulse and reference pulse. Such a collision may cause a wrong phase shift between I and Q local oscillator signals. If such a problem occurs, the only way to correct it is by applying a RESET signal, and one would not want to do that too often. Despite its simple design, this version of the mixer has issues with timing, limiting its performance.

Figure 2:
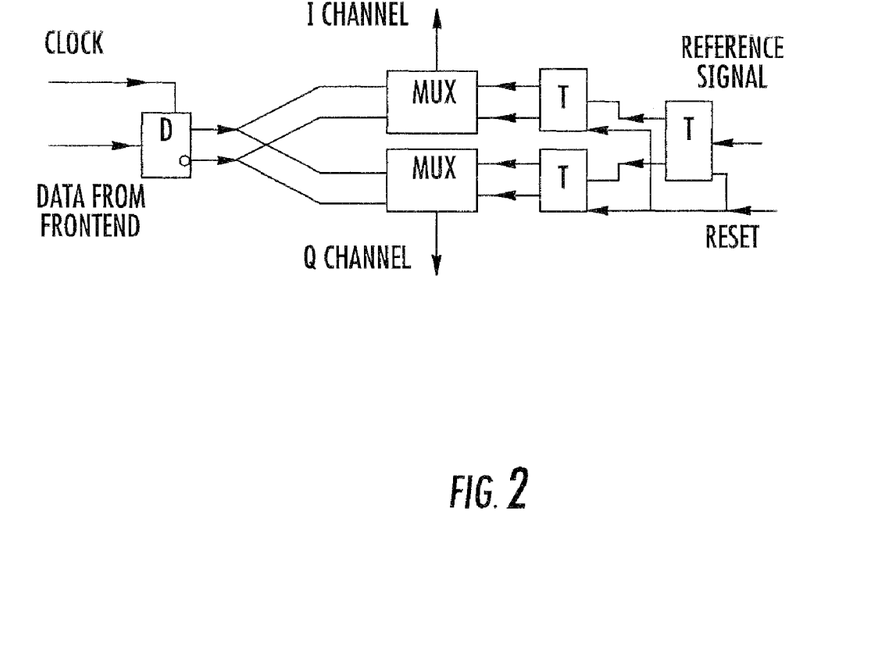
FIG. 2 is an exemplary embodiment of a streaming Mixer in accordance with one aspect of the invention.

To avoid this problem, we have designed a second novel mixer performing single-bit-stream XOR multiplication (FIG. 2). In this case, we use the simple fact that A XOR 0=A and A XOR 1=$\overline{A}$. A Rapid Single-Flux-Quantum (RSFQ) D flip-flop with complementary outputs (DFFC) (schematics and optimal parameters are in Kirichenko et al., "A 4-bit Single Flux Quantum Decoder," IEEE Transactions on Applied Superconductivity, Vol. 5, No. 2, p. 2857, June 1995), converts the modulated signal into a single-bit data stream along with its inverted (complementary) representation. Multiplexing direct and inverted data outputs to the proper channel, it performs digital Quadrature signal down-conversion. After the modulated signal passes through a D flip-flop with complementary outputs (DFFC), it becomes asynchronous. Multiplexing direct and inverted data outputs to the proper channel, we effectively perform digital I/Q signal down-conversion. The multiplexing is done by two multiplexer cells controlled by the same T flip-flop binary tree as in FIG. 1, providing a 90 degree phase shift between I and Q channels. Again this circuit can be applied to single channel mixing as well as to I/Q quadrature mixing.

Figure 3A:
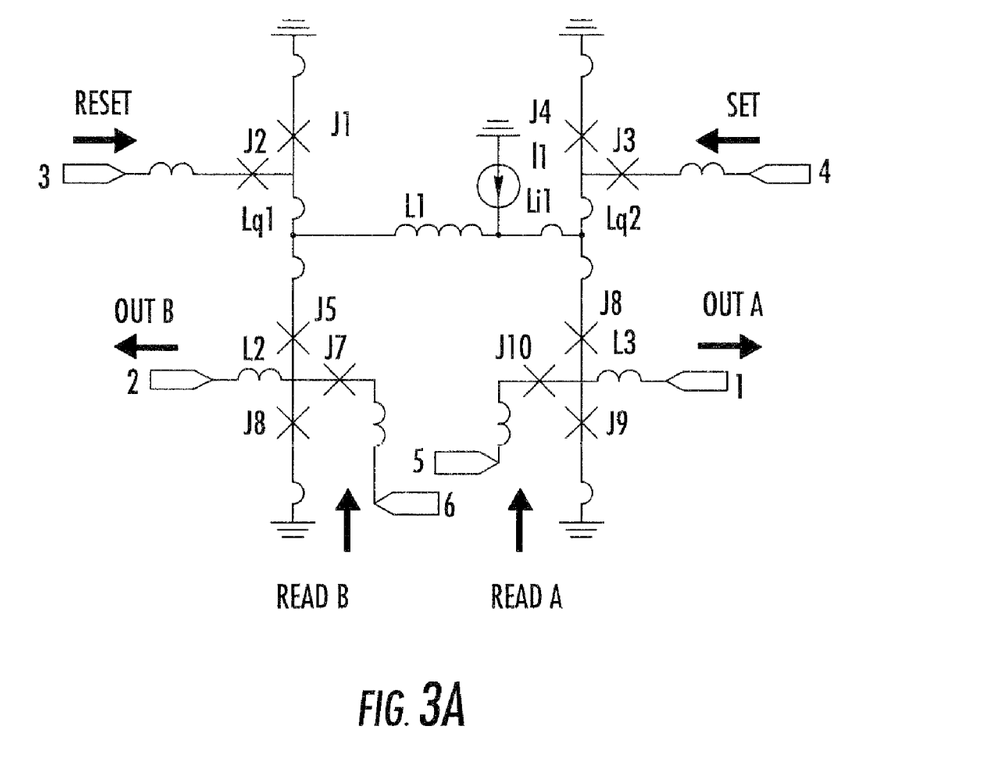
FIG. 3A is a diagram of a dual port NDRO cell, which can be utilized for the multiplexer of FIG. 2.
Figure 3B:
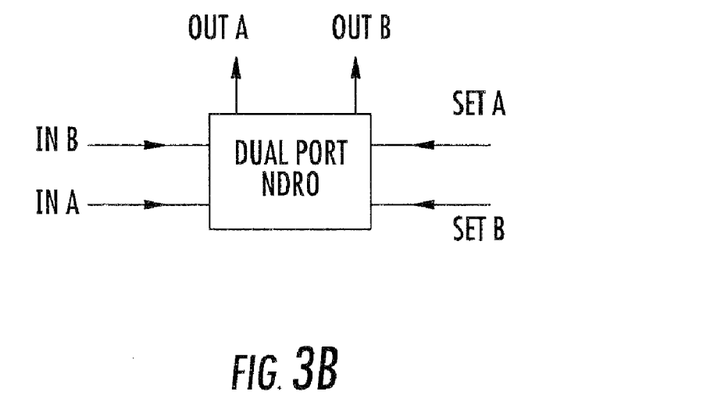
FIG. 3B is a block diagram of the circuit of FIG. 3A.

The multiplexer cell is shown in FIG. 3. This cell basically comprises a dual-port NDRO cell. From this cell, a designer can build either a demultiplexer by merging inputs A and B, or a multiplexer by merging outputs A and B. See article by Kirichenko et al., "A 4-bit Single Flux Quantum decoder," IEEE Transactions on Applied Superconductivity, Vol. 5, No. 2, p. 2857, June 1995.

We have designed and fabricated the FIG. 3 version of the digital I/Q Mixer using the standard HYPRES 1 kA/cm$^2$ fabrication process. The same design was also converted to the standard HYPRES 4.5 kA/cm$^2$ fabrication process.

The multiplexing is done by two 2×1 RSFQ switches. The basic switch cell shown in FIG. 3A comprises a dual-port RSFQ Non-Destructive Read-Out (NDRO) cell with merged outputs, i.e., electrically connected outputs 1, 2. Applying an SFQ pulse to the input "Set A" causes the switch to connect input terminal "In A" to the output terminal "Out A" and disconnect terminal "In B". Applying an SFQ pulse to the input "Set B" causes the switch to connect input terminal "In B" to the output terminal "Out B" and disconnect terminal "In A". The optimized parameters for the cell in FIG. 3A are in Table 1.

TABLE 1

Optimized parameters for the dual-port NDRO cell, normalized to reference

| Critical Current | mA | Inductance | pH | Bias current | mA |
|---|---|---|---|---|---|
| J1 | 2.94 | L1 | 1.56 | I1 | 1.92 |
| J2 | 2.78 | LQ1 | 0.60 | | |
| J3 | 2.16 | LQ2 | 1.22 | | |
| J4 | 1.95 | LJ1 | 0.03 | | |
| J5 | 1.25 | LJ4 | 0.04 | | |
| J6 | 1.60 | LJ5 | 0.06 | | |
| J7 | 1.88 | LJ6 | 0.29 | | |
| J8 | 1.55 | LJ7 | 0.50 | | |
| J9 | 2.07 | LJ8 | 0.01 | | |
| J10 | 2.89 | LJ9 | 0.51 | | |
| | | LJ10 | 0.34 | | |

Both switches are controlled by a resettable T flip-flip binary tree. See description of T1 cell in S. Polonsky, et al., "Single Flux Quantum T flip-flop and its possible applications", IEEE trans. On Appl. Supercond., vol. 4, p. 9, 1994, for the schematics and optimal parameters of the resettable TFF. The TFF tree converts a periodic reference signal into a control sequence of the switches, effectively creating two 90-degree phase-shifted Local Oscillator square-wave signals of a half reference signal frequency.

Figure 4:
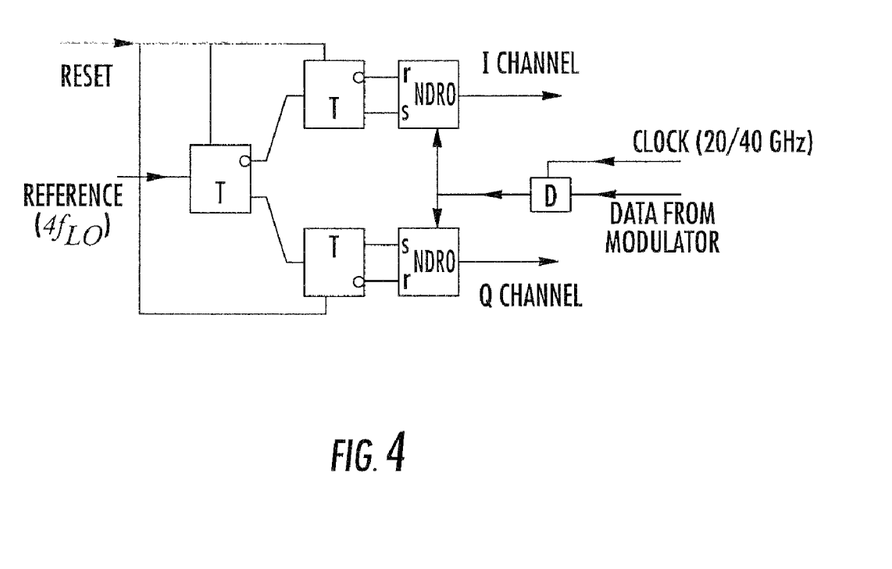
FIG. 4 is a diagram of a digital Mixer utilizing an NDRO cell to perform AND functionality asynchronously.

FIG. 4 is a diagram of a digital I/Q Mixer utilizing an NDRO cell to perform an AND function asynchronously. Like the other mixer designs, a reference clock drives a binary tree of T flip-flops with the outputs of the T flip-flop driving respective NDRO cells which perform an AND function with the data arriving from the delta-sigma modulator over a type D flip-flop.

Each of the three mixers described heretofore have their advantages and drawbacks. The circuit shown in FIG. 4, employing an AND operation has a poor signal-to-noise ratio because of a DC component in the local oscillator. However, it is feasible for a multi-bit implementation.

The digital I/Q Mixer employing XOR operation shown in FIG. 1, has good gain and a good signal-to-noise ratio but there is no obvious multi-bit implementation.

The streaming I/Q Mixer shown in FIG. 2, takes care of timing and synchronization issues, but may be hard to design for multi-bit data streams. Thus, each of the three mixers described is preferred for a particular application.

The XOR mixer shown in FIG. 1, utilizes a T flip-flop, an RS-type NDRO, an XOR cell and a D flip-flop (single output).

The streaming I/Q Mixer shown in FIG. 2 utilizes the multiplexer shown in FIG. 3 and a D flip-flop with complementary outputs.

The AND gate mixer shown in FIG. 4, utilizes T flip-flops, a multiplexer, such as that shown in FIG. 3, and a D flip-flop with complementary outputs. Each of these elements utilized to construct the mixers described so far will now be described in more detail.

Figure 5:
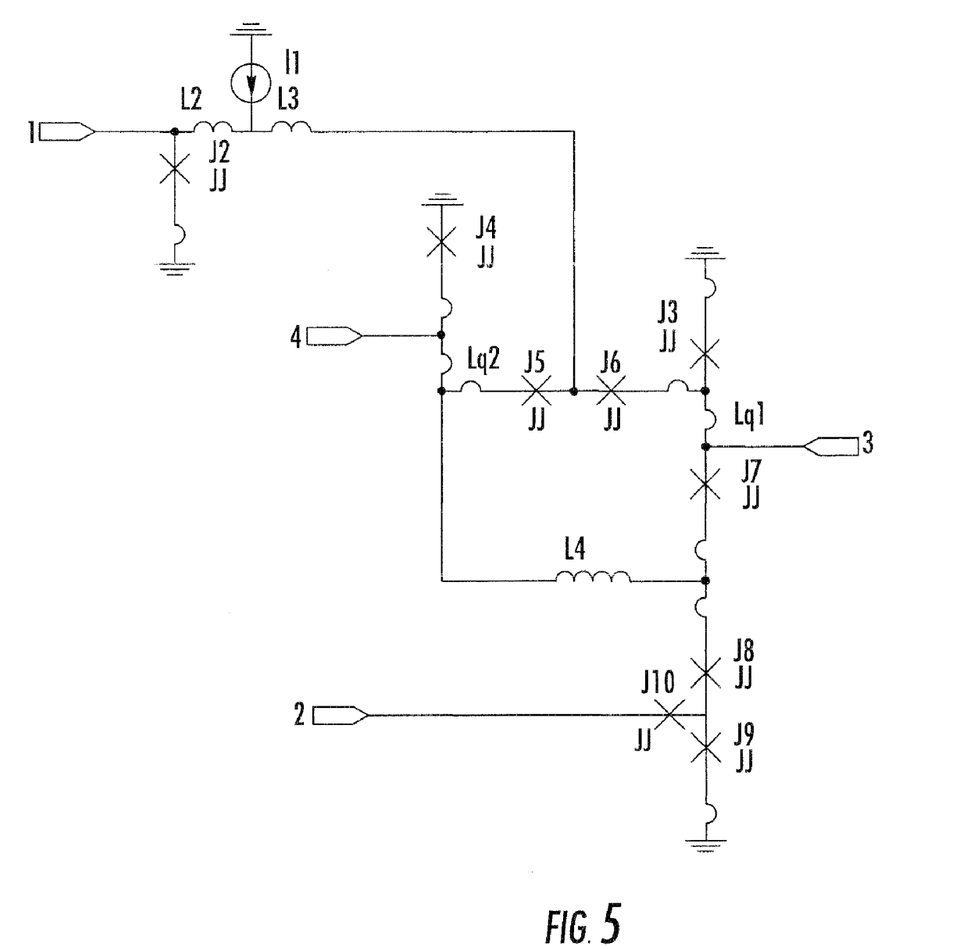
FIG. 5 is a circuit diagram of a resettable T flip-flop used in connection with the circuits of FIGS. 1, 2 and 4.

FIG. 5 shows a circuit for construction of an SFQ resettable toggle flip-flop as used in the construction of the circuit of FIG. 1. The parameters for this schematic are found in the Polonsky article, S. Polonsky et al., "Single Flux, Quantum B Flip-flop and Its Possible Applications", IEEE, vol. 4, no. 1, March 1994, p. 9.

The normalized "Personal Superconducting Circuit ANalayzer" (Polonsky, S.; Shevchenko, P.; Kirichenko, A.; Zinoviev, D.; Rylyakoy, A., "PSCAN'96: New Software for Simulation and Optimization of Complex RSFQ Circuits", IEEE Transactions on Applied Superconductivity, Volume 7, Issue 2, June 1997 Page(s): 2685-2689) (PSCAN) units are normalized to 125 pA for junction critical currents in and bias current values I, and to 2.63 pA for inductance values L.

Figure 6A:
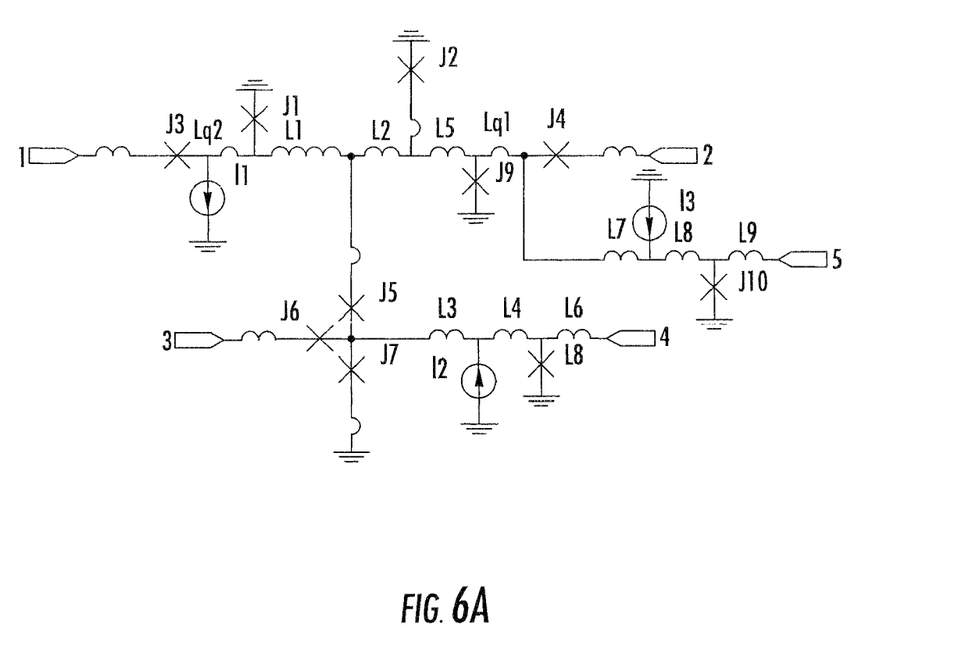
FIG. 6A is a diagram of a Reset-Set (RS) type NDRO cell used in the circuit of FIG. 1.
Figure 6B:
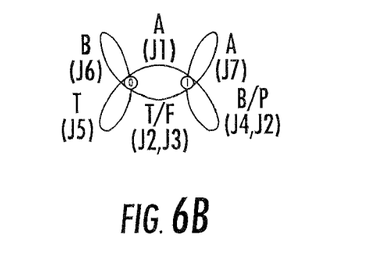
FIG. 6B is a partial Moore diagram of an RS-type NDRO cell used in FIG. 6A.

FIG. 6A is a diagram of an RS-type NDRO cell used in FIG. 1.

This cell functions as a Non-Destructive Read-Out with a single bit memory. One can change the state of the NDRO by applying the Reset or Set inputs. If the cell is in state "1", then the Read input pulse goes to the Output. If the cell is in state "0", then the Read input pulse is prevented from going to the Output.

The normalized PSCAN values for the circuit of FIG. 6A are as follows:
J1=3.15, J2=2.19, J3=2.21, J4=2.63, J5=1.32, J6=2.34, J7=2.39, J8=2.54, J9=2.02, J10=2.13,
I1=1.80, I2=2.42, I3=1.93,
LQ1=0.16, LQ2=0.16,
L1=1.37, L2=0.48, L3=0.10, L4=0.80, L5=0.53, L6=1.68, L7=0.66, L8=0.61, L9=0.32,
LJ2=0.80, LJ3=0.49, LJ4=0.21, LJ5=0.16, LJ6=0.25, LJ7=0.19,
XN=1.00.

Figure 7A:
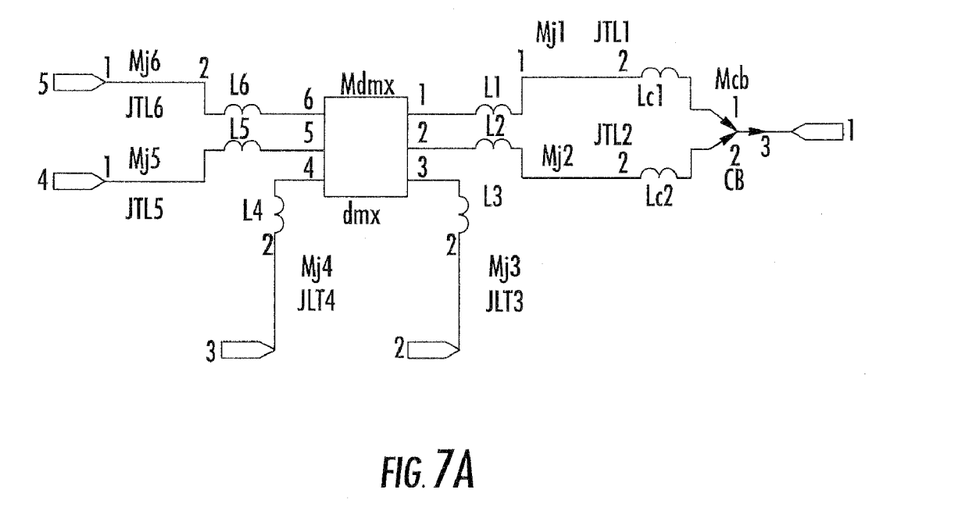
FIG. 7A is a circuit diagram of an XOR-type streaming mixer.

FIG. 7A is a circuit diagram of an XOR-type streaming mixer, indicated by the MUX cell in FIG. 2.

Figure 7B:
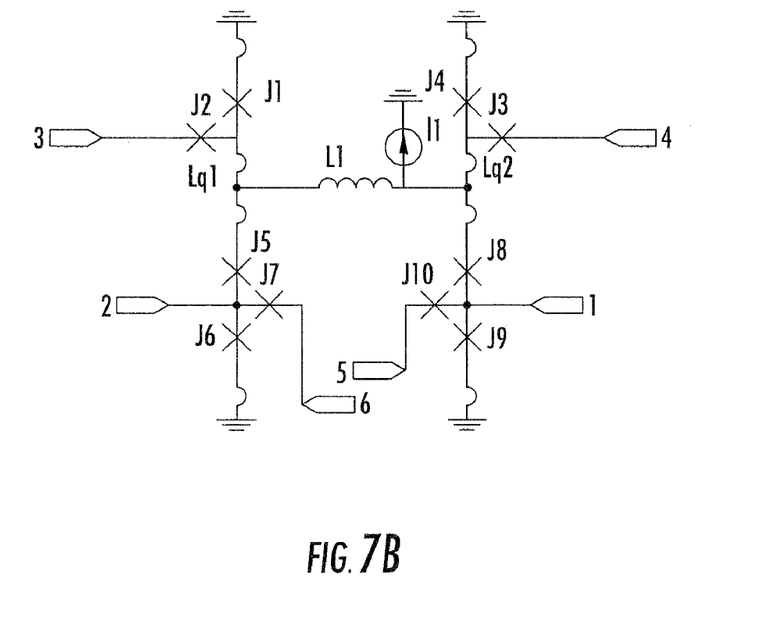
FIG. 7B is a diagram of a NDRO Multiplexer/Demultiplexer cell used in the XOR-type streaming mixer of FIG. 7A.

FIG. 7B is a diagram of a Multiplexer/Demultiplexer cell used in the XOR circuit of FIG. 7A.

This RSFQ logic circuit functions as a multiplexer or demultiplexer, combining two input pulse streams into a single output stream or conversely. This was described in the U.S. Pat. No. 5,982,219, invented by A. Kirichenko (1999).

The normalized PSCAN values for the circuit of FIG. 7B are as follows: L1=4.51, L2=1.77, L3=0.37, L4=0.60, L5=0.30, L6=0.62, LC1=1.14, LC2=0.75.

Figure 8A:
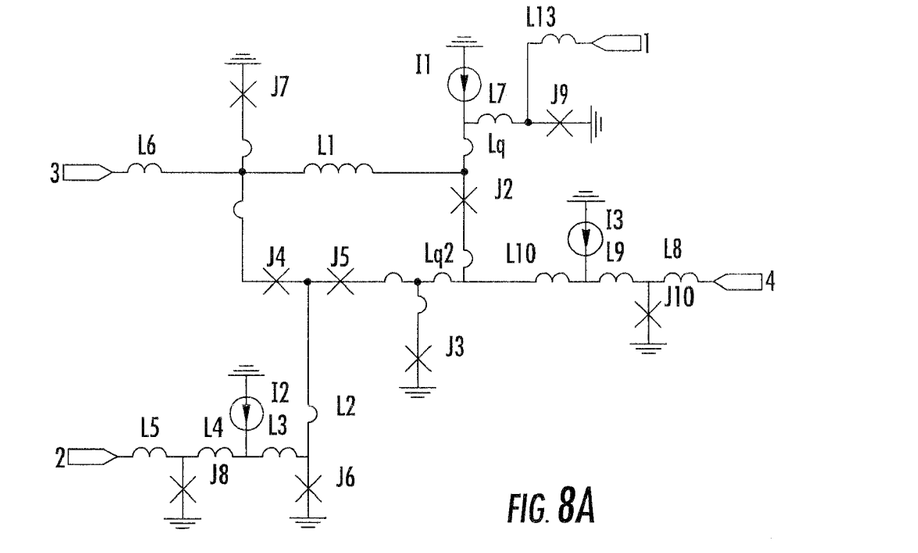
FIG. 8A is a circuit diagram of a D flip-flop used in the circuits of FIGS. 1, 2 and 4.

FIG. 8A shows a circuit for an SFQ D flip-flop as used in the construction of the circuit of FIGS. 1 and 4 in which the complementary output is not used, and in FIG. 2, which uses the complementary output. If the data input is "1" (i.e., an SFQ pulse) then the True output gives "1" and the Complement gives "0". If the data input is "0" (i.e., no SFQ pulse), then the True output gives "0" and the Complement gives "1".

The normalized PSCAN values for the circuit of FIG. 8A are as follows:
I1=2.04, I2=4.45, I3=0.83,
J2=1.41, J3=1.41, J4=1.96, J5=2.42, J6=2.94, J7=2.82, J8=2.43, J9=1.96, J10=1.00,
L1=1.50, L2=0.30, L3=0.31, L4=0.74, L5=0.70, L6=2.28, L7=1.20, L8=1.20, L9=0.94, L10=2.00, L13=1.00,
LJ2=0.08, LJ3=0.29, LJ4=0.19, LJ5=0.09, LJ7=0.45,
LQ=0.23, LQ2=0.02.

Figure 8B:
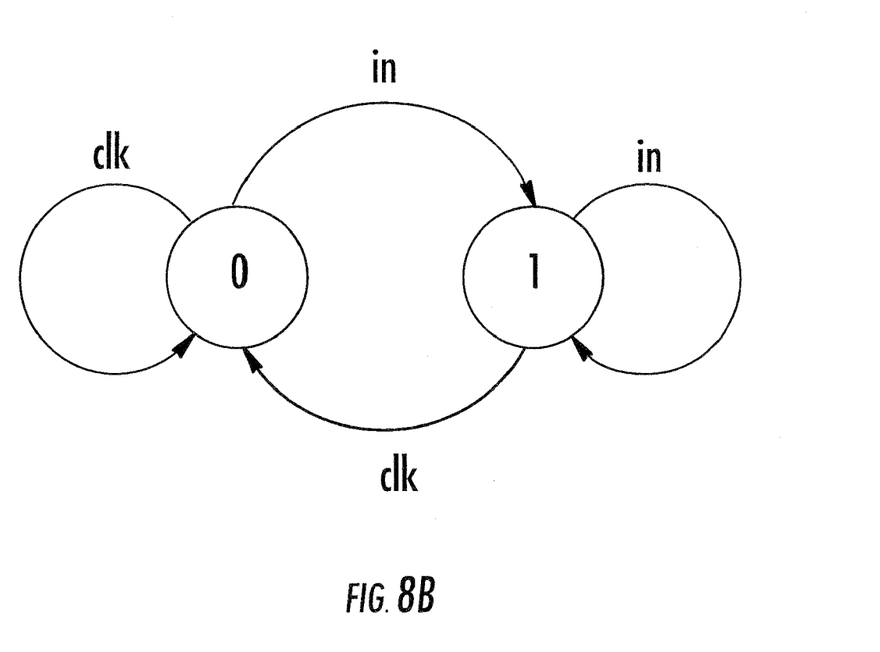
FIG. 8B is a partial Moore diagram of the circuit shown in FIG. 8A.

FIG. 8B shows a partial Moore diagram of the D flip-flop used in FIG. 1.

Figure 9:
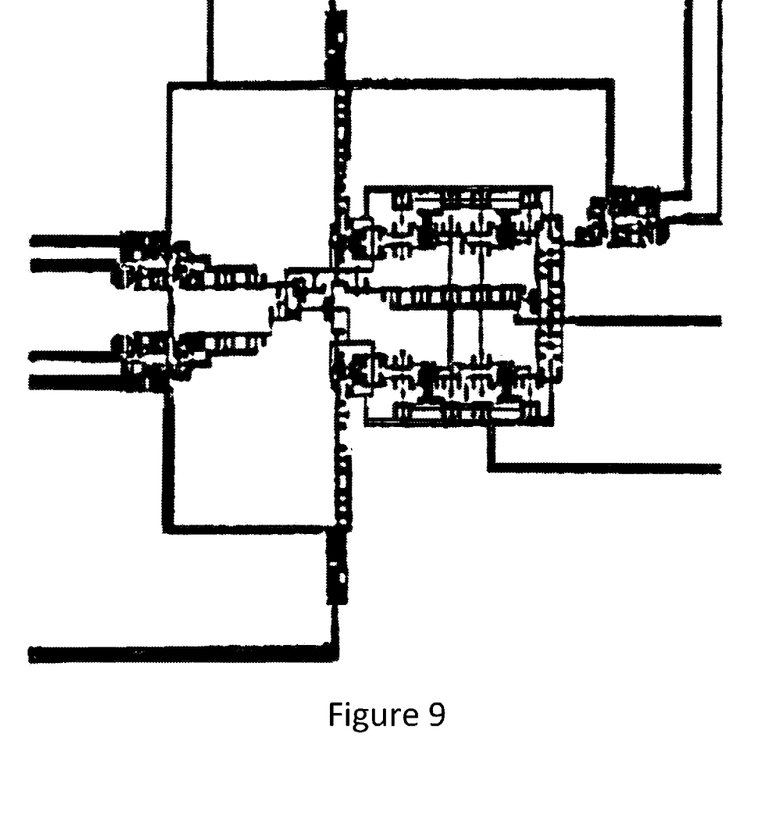
FIG. 9 is an exemplary layout of a digital I/Q Mixer illustrated in FIG. 1.

FIG. 9 is an exemplary layout of a digital I/Q Mixer of the type shown in FIG. 1.

Figure 10:
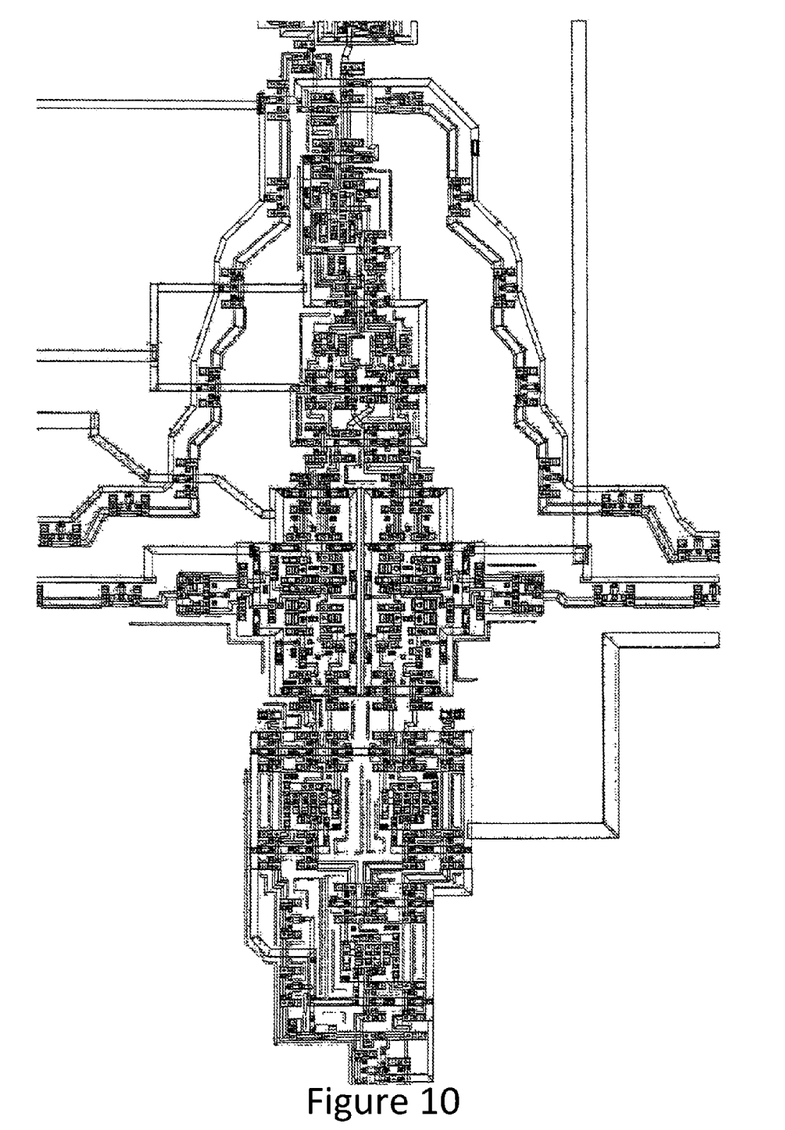
FIG. 10 is an exemplary layout of a digital I/Q Mixer utilized in FIG. 2.

FIG. 10 is an exemplary layout of a digital I/Q Mixer of the type shown in FIG. 2.

Figure 11:
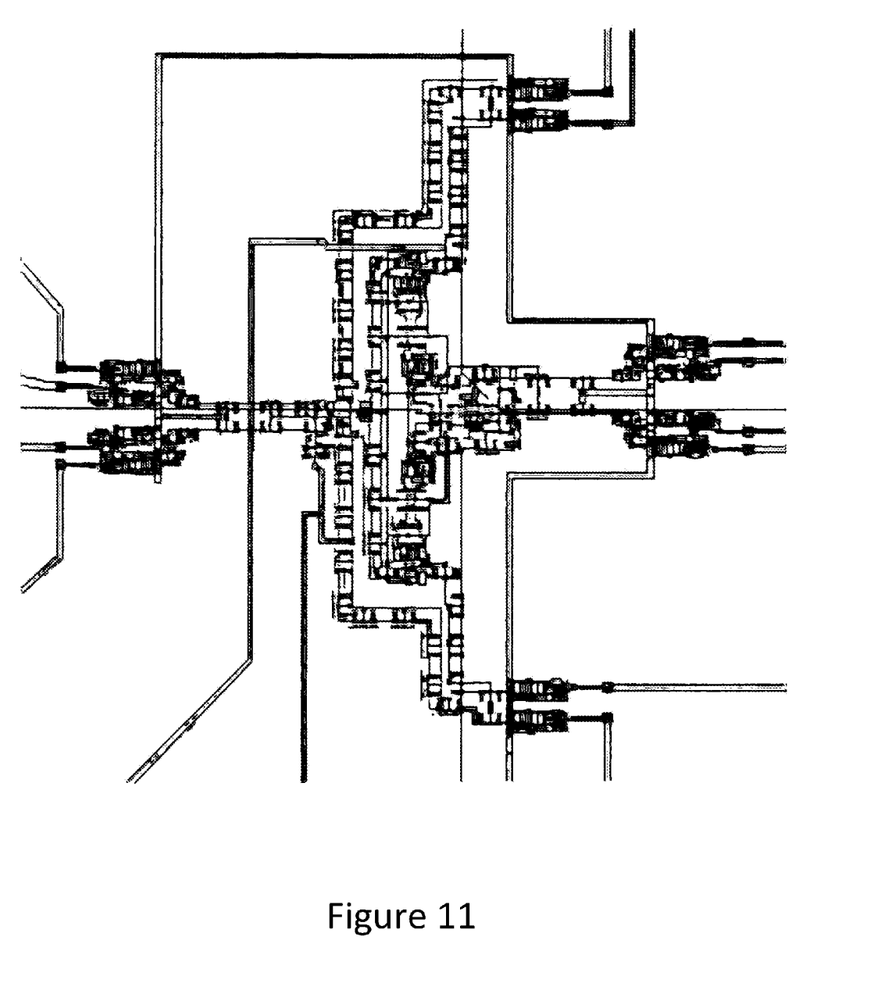
FIG. 11 is an exemplary layout of a digital I/Q Mixer shown in FIG. 4.

FIG. 11 is an exemplary layout of a digital I/Q Mixer of the type shown in FIG. 4.

Figure 12:
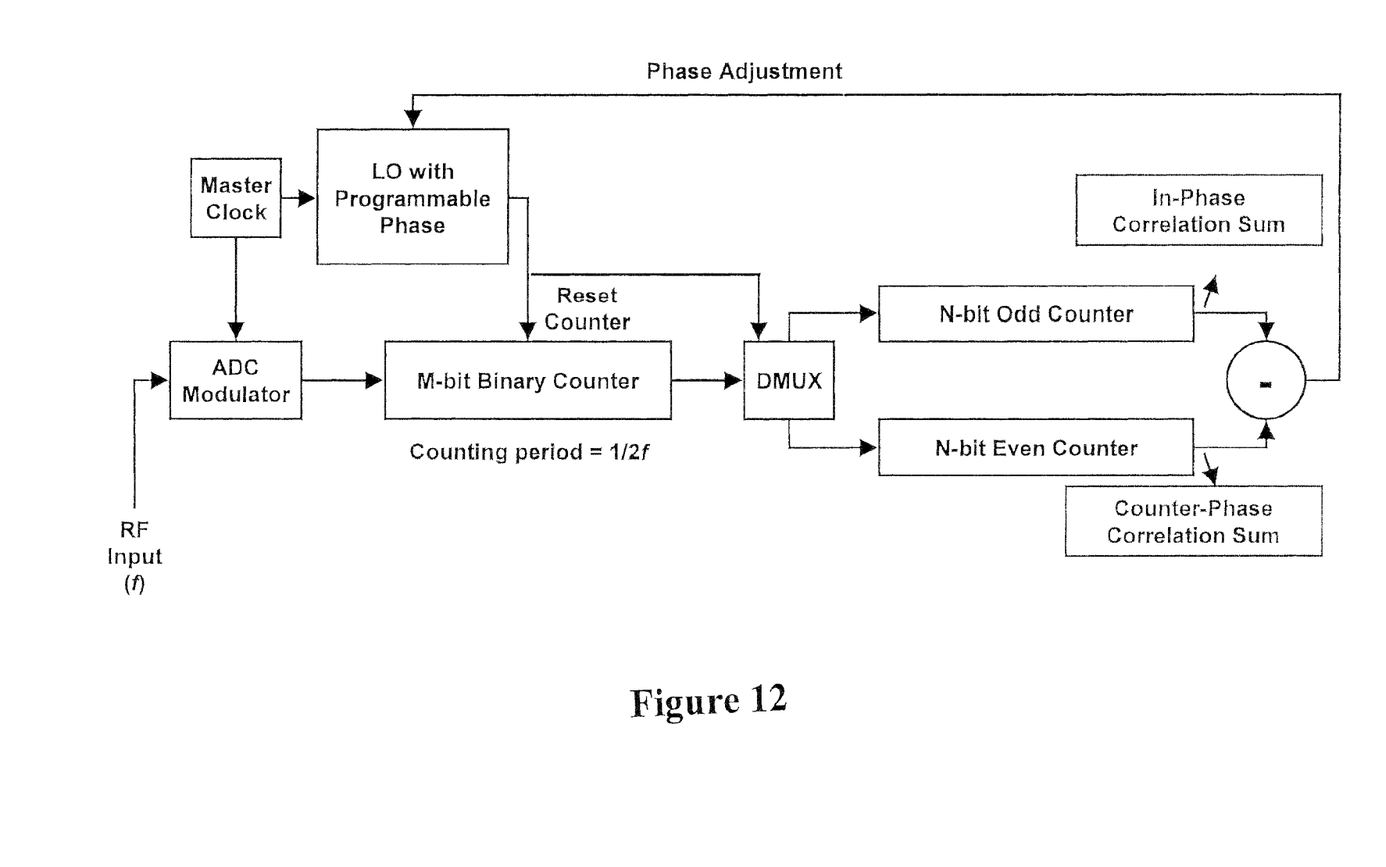
FIG. 12 is a block diagram of a correlation receiver in accordance with one aspect of the invention.

FIG. 12 is a block diagram of a correlation receiver in accordance with one aspect of the invention.

Figure 13:
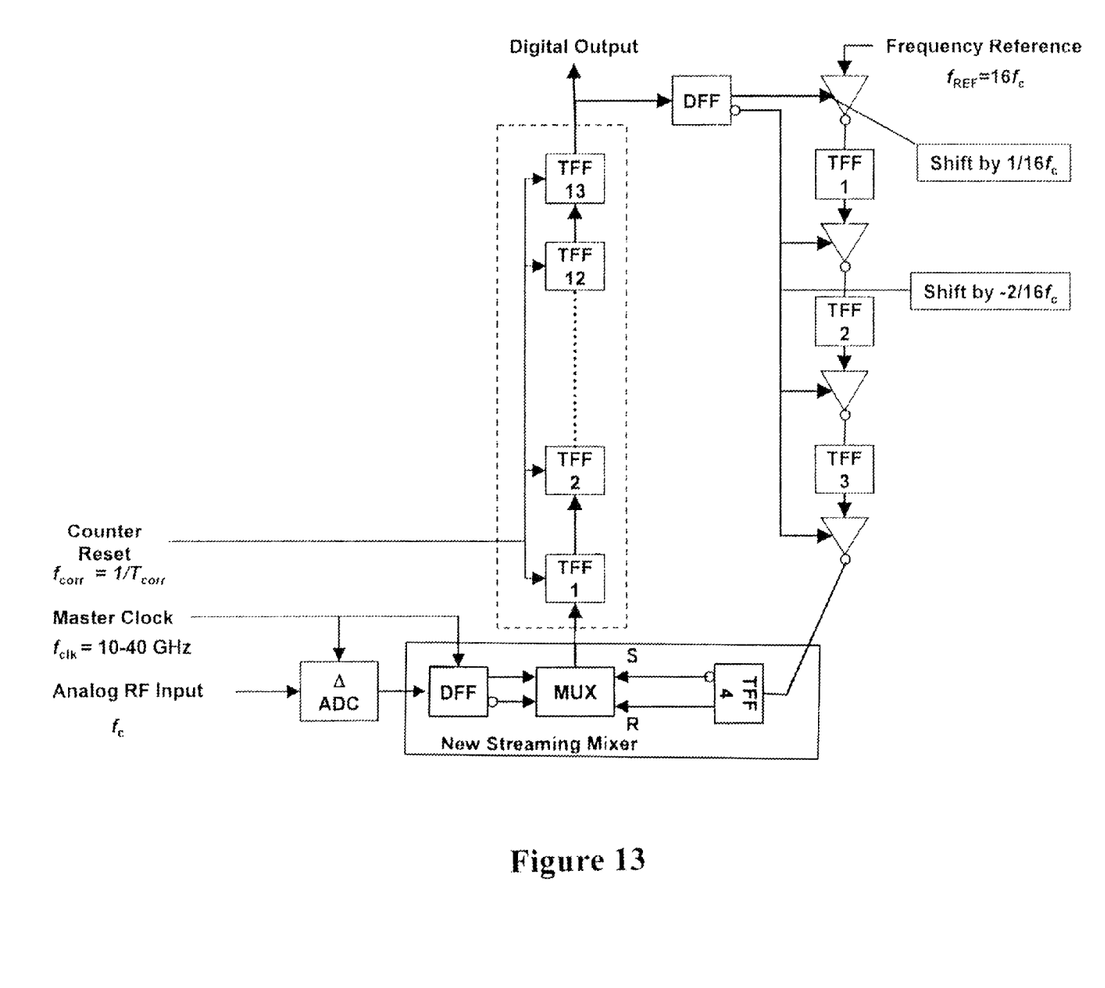
FIG. 13 shows portions of the circuit of FIG. 12 in more detail.

Turning to FIG. 13, Raw analog RF input is applied to an analog to digital convener (ADC) preferably to an oversampled delta modulator or delta sigma modulator. The output of the ADC is passed to a D flip-flop with complementary outputs and then to a multiplexer MUX. The output of the multiplexer is then passed to a chain of T flip-flops TFF1-TFF13 in this example the output (Digital Output) is taken from the last T flip-flop. The Digital Output is passed to another D flip-flop with complementary outputs to control the phase shift imported to a frequency reference by a string of alternating inverters and T flip-flop (TFF 1-4) cells. The output of the last T flip-flop connects to the set/reset inputs of the multiplexer of the streaming mixer.

While various embodiments of the present invention have been illustrated herein in detail, it should be apparent that modifications and adaptations to those embodiments may occur to those skilled in the art without departing from the scope of the present invention as set forth in the following claims.

What is claimed is:

1. A digital mixer comprising:
an input circuit adapted to receive an incoming signal;
a reference circuit, adapted to receive a reference signal not synchronized with said incoming signal; and
a mixing circuit adapted to mix said incoming signal and said reference signal to generate an output signal having a spectrum with mixed signal products, comprising at least one superconducting non-destructive readout cell which does not receive a clock signal;
wherein at least one of the incoming signal and the reference signal is a multibit amplitude representation digital signal, generated by a circuit comprising a plurality of elements which are configured to generate concurrent digital data signals each having respectively a different magnitude relationship to the represented multibit amplitude.

2. The digital mixer of claim 1, wherein said mixing circuit comprises a Rapid Single Flux Quantum circuit.

3. The digital mixer of claim 2, wherein said mixing circuit further comprises an XOR gate.

4. The digital mixer of claim 1, wherein said mixing circuit comprises a pair of multiplexers.

5. The digital mixer of claim 1, wherein at least one of said input and reference circuit comprises a D flip-flop.

6. The digital mixer of claim 1, wherein at least one of said input and reference circuit comprises a T flip-flop.

7. A cross correlator using the digital mixer of claim 1.

8. A digital receiver using the cross correlator of claim 7.

9. A mixer for mixing a square wave reference signal with an incoming signal comprising:
a reference circuit adapted to receive said reference signal and adapted to produce a plurality of local signals with respectively different phases;
an input circuit adapted to receive said incoming signal and adapted to produce a plurality of input signals having respectively different phases;
wherein at least one of said plurality of local signals and said plurality of input signals is a multibit amplitude digital signal, generated by a circuit comprising a plurality of elements which are configured to generate concurrent digital data signals each having respectively a different magnitude relationship to the represented multibit amplitude;
a plurality of substantially unclocked mixing circuits, each adapted to receive a complementary set of said plurality of local signals and a complementary set of said plurality of input signals, each comprising a superconducting dual-port non-destructive readout cell; and
an output from each mixing circuit adapted to provide an output signal having a spectrum with mixed signal products of the incoming signal and a respective phase of the reference signal.

10. The mixer of claim 9, wherein said plurality of mixing circuits comprise Rapid Single Flux Quantum circuits.

11. The mixer of claim 10, wherein said plurality of mixing circuits further comprise an XOR gate.

12. The mixer of claim 9, in which said plurality of mixing circuits each comprise a multiplexer.

13. The mixer of claim 9, in which at least one of said reference circuit and said input circuit comprises a D flip-flop.

14. The mixer of claim 9, in which at least one of said reference circuit and said input circuit comprises a T flip-flop.

15. A digital mixing method, comprising:
receiving an incoming signal;
receiving a reference signal not synchronized with said incoming signal; and
mixing said incoming signal and said reference signal in a mixing circuit comprising at least one superconducting non-destructive readout cell which does not receive a clock signal, to generate an output signal having a spectrum with mixed signal products;
wherein at least one of the incoming signal and the reference signal is a concurrent multibit amplitude representation digital signal, each bit of the multibit amplitude representation having respectively a different magnitude relationship to the represented multibit amplitude.

16. The method of claim 15, wherein said mixing circuit comprises a Rapid Single Flux Quantum circuit.

17. The method of claim 16, wherein said mixing circuit comprises an XOR gate.

18. The method of claim 15, wherein said mixing circuit comprises a pair of multiplexers.

19. The method of claim 15, wherein at least one of said input signal and reference signal is received from a circuit comprising a D flip-flop.

20. The method of claim 15, wherein at least one of said input signal and reference signal is received from a circuit comprising a T flip-flop.

* * * * *